United States Patent [19]

O'Dea

[11] 4,167,682

[45] Sep. 11, 1979

[54] OVERSHOOT SUPPRESSION CIRCUITRY FOR TERNARY PULSES

[75] Inventor: Orrin B. O'Dea, Garden Grove, Calif.

[73] Assignee: Communication Manufacturing Co., Long Beach, Calif.

[21] Appl. No.: 848,267

[22] Filed: Nov. 3, 1977

[51] Int. Cl.² .................... H03K 5/08; H03K 5/18
[52] U.S. Cl. .................... 307/237; 307/266; 307/236; 307/268; 307/311; 328/165
[58] Field of Search .............. 307/237, 217, 266, 268, 307/262, 236, 254, 255, 311; 330/271; 328/162, 165

[56] References Cited

U.S. PATENT DOCUMENTS

| | | | |
|---|---|---|---|
| 3,421,099 | 1/1969 | O'Malley | 330/271 |
| 3,448,395 | 6/1969 | Webb | 330/298 |
| 3,490,027 | 1/1970 | Galetto et al. | 363/24 |
| 3,825,773 | 7/1974 | Kivistik | 307/237 X |

Primary Examiner—John Zazworsky
Attorney, Agent, or Firm—Christie, Parker & Hale

[57] ABSTRACT

First and second indicating circuits connect a source of ternary pulses to a load. The ternary pulses are subject to baseline overshoot above a threshold level for a given period of time after the termination of each pulse. The first indicating circuit transmits an indication to the load responsive to ternary pulses of positive polarity above the threshold level. The second indicating circuit transmits an indication to the load responsive to ternary pulses of negative polarity above the threshold level. Transmission of an indication to the load by the second indicating circuit is inhibited for the given period of time after the termination of a ternary pulse of positive polarity above the threshold level to suppress negative baseline overshoot. Transmission of an indication to the load by the first indicating circuit is inhibited for the given period of time after the termination of a pulse of negative polarity above the threshold level to suppress positive baseline overshoot. The load is preferably an up-down counter that senses errors in the ternary pulse pattern. The indicating circuit each include a normally nonconducting switching transistor, inhibited by clamping circuits which are controlled by cross coupled feedback paths having a significant transmission delay relative to the duration of the ternary pulses, but smaller than the minimum interval between successive ternary pulses. In one embodiment, the level of the ternary pulses is sensed by a light emitting diode optically coupled to a photo resistor, which shunts the source for purposes of automatic gain control. In another embodiment, a bias turn-on switch is actuated when a minimum pulse level occurs.

17 Claims, 3 Drawing Figures

OVERSHOOT SUPPRESSION CIRCUITRY FOR TERNARY PULSES

BACKGROUND OF THE INVENTION

This invention relates to ternary pulse transmission and, more particularly, to noise suppression circuitry for ternary pulses.

Ternary pulse signals assume one of three states, namely, a state represented by a positive pulse, a state represented by a negative pulse, and a state represented by no pulse. In telephony, ternary pulses are commonly employed to carry signals on the transmission lines and networks. For example, the well known T-carrier transmits telephone signals in pulse code modulation form on interoffice and short haul trunks originally installed for other types of carrier transmission systems or direct voice transmission. In a T-carrier system, a pulse in a time slot or bit position represents one binary value, and the absence of a pulse in a time slot or bit position represents the other binary value. Successive pulses alternate in polarity. Accordingly, one technique to monitor the performance of the system is to compare the polarity of successive pulses. Successive pulses of the same polarity indicate an error.

The limited bandwidth of transmission lines that carry ternary pulses gives rise to peak overshoot at the leading edge of the pulses, and baseline overshoot at the trailing edge of the pulses. In equalizing transmission lines, such overshoot is often introduced at the transmission end of the line. Baseline overshoot is particularly troublesome because it closely resembles the ternary pulses themselves. A discriminator may have difficulty distinguishing between baseline overshoot and information pulses if the baseline overshoot is nearly as large as the threshold level of the pulse discriminator.

SUMMARY OF THE INVENTION

According to the invention, first and second indicating circuits connect a source of ternary pulses to a load. The ternary pulses are subject to baseline overshoot above a threshold level for a given period of time after termination of each pulse. The first indicating circuit transmits an indication to the load responsive to ternary pulses of positive polarity above the threshold level. The second indicating circuit transmits an indication to the load responsive to ternary pulses of negative polarity above the threshold level. Transmission of an indication to the load by the second indicating circuit is inhibited for a given period of time after the termination of a ternary pulse of positive polarity above the threshold level to suppress negative baseline overshoot. Transmission of an indication to the load by the first indicating circuit is inhibited for the given period of time after the termination of a pulse of negative polarity above the threshold level to suppress positive baseline overshoot. Thus, the indicating circuits are able to distinguish between ternary pulses and baseline overshoot above the threshold level, which permits the accommodation of ternary pulses varying in level over a wide range.

Preferably, the first and second indicating circuits comprise first and second switching transistors each having an input connected to an ungrounded output terminal of the source, and an output connected to the load. The output of each switching transistor is high when its input is low, and vice versa. Transmission of indications to the load is inhibited by first and second inverters each having a significant transmission delay relative to the ternary pulses, but smaller than the minimum interval between successive ternary pulses, and first and second clamping circuits each having an output that clamps the input of one of the switching transistors low when the input of the corresponding clamping circuit is high, to prevent the output of the switching transistor from going low. The input of the first inverter is connected to the output of the second transistor and the output of the first inverter is connected to the input of the first clamping circuit, to prevent the output of the first switching transistor from becoming low. The input of the second inverter is connected to the output of the first transistor and the output of the second inverter is connected to the input of the second clamping circuit, to prevent the output of the second transistor from becoming low. In the absence of ternary pulses, the switching transistors are both high and the clamping circuits are not clamping the inputs of the switching transistors. As a result, very little power is dissipated by the circuitry.

According to one aspect of the invention, a normally closed switch is connected between a first ungrounded output terminal of a source of ternary pulses and a load. A second normally closed switch is connected between a second ungrounded output terminal of the source of ternary pulses and the load. After a time delay, the second switch is opened during a time interval equal to the duration of a pulse of a given polarity at the first output terminal of the source to prevent transmission by the second switch. After a time delay, the first switch is opened during a time interval equal to the duration of a pulse of the given polarity at the second output terminal of the source to prevent transmission by the first switch. The result is suppression of the baseline overshoot to which the ternary pulses are subjected.

A feature of the invention is an arrangement that, without an ON-OFF switch, does not consume appreciable battery current when the circuitry is not in use. In one embodiment, a light emitting diode is optically coupled to a photosensitive resistor for purposes of automatic gain control. The light emitting diode senses the level of the ternary pulses and changes the resistance of the photosensitive resistor, which shunts the ungrounded output terminals of the source of ternary pulses, to counteract changes in the level of the ternary pulses. In another embodiment, the circuitry is biased to a low level only sufficient to actuate a bias turn-on switch. When a minimum pulse level occurs, the switch raises the bias level to the normal operating value.

BRIEF DESCRIPTION OF THE DRAWINGS

The features of specific embodiments of the best mode contemplated of carrying out the invention are illustrated in the drawings, in which.

DETAILED DESCRIPTION OF THE SEPCIFIC EMBODIMENT

Figure 1:
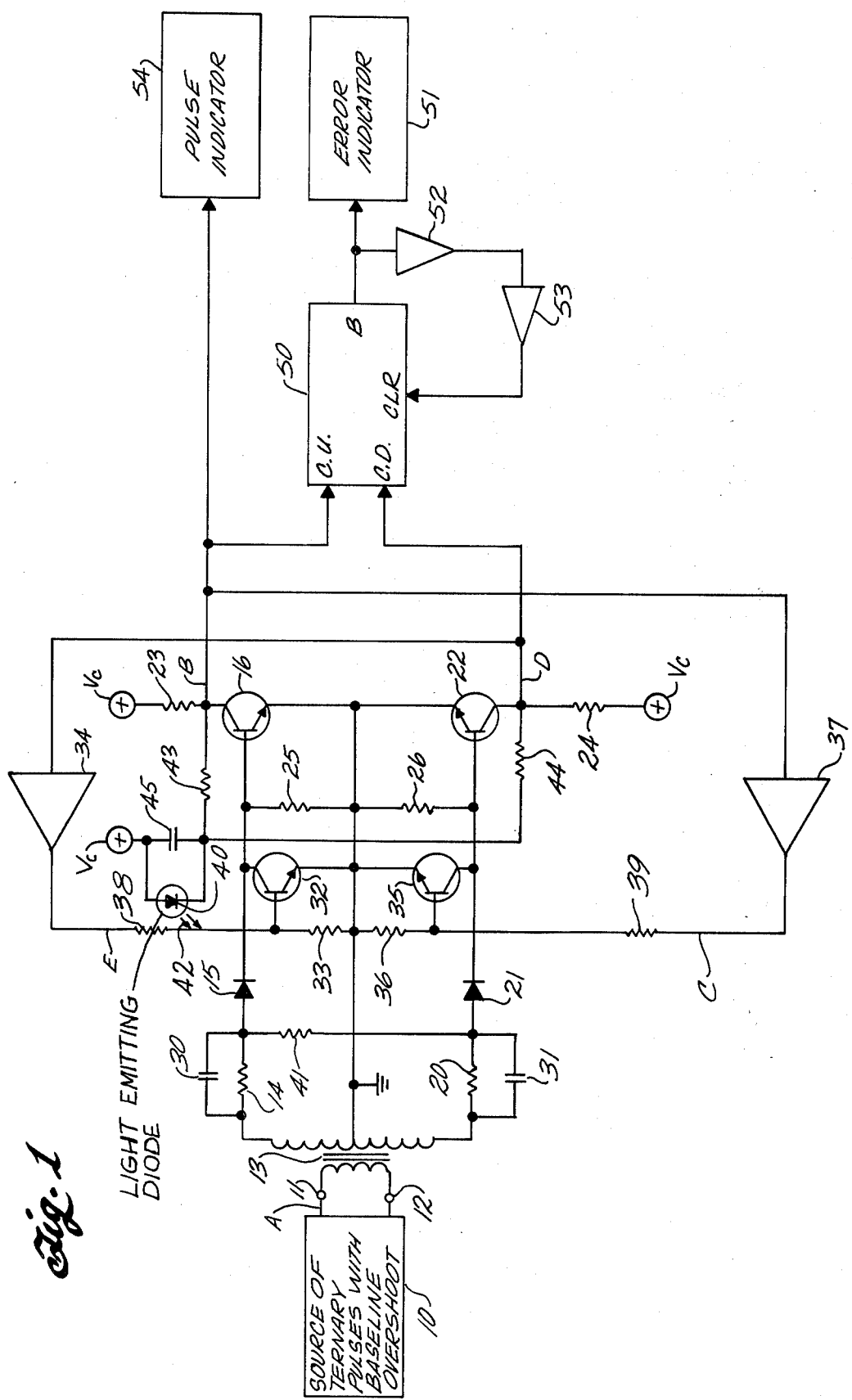
FIG. 1 is a schematic circuit diagram partially in block form of one embodiment of overshoot suppression circuitry incorporating the principles of the invention.

In FIG. 1, a source 10 of ternary pulses with baseline overshoot has ungrounded output terminals 11 and 12 connected to the primary winding of a transformer 13. The secondary winding of transformer 13 has a center tap connected to ground, one end terminal connected by a resistor 14 and a diode 15 in series to the base terminal of an NPN switching transistor 16, and another end terminal connected by a resistor 20 and a diode 21 in series to the base terminal of an NPN switching transistor 22. The emitters of transistors 16 and 22 are directly connected to ground. The collector of transistor 16 is connected by a load resistor 23 to a source $V_c$ of positive bias potential. The collector of transistor 22 is connected by a load resistor 24 to source $V_c$. An input resistor 25 is coupled between the base of transistor 16 and ground, and an input resistor 26 is coupled between the base of transistor 22 and ground. A capacitor 30 shunts resistor 14 and a capacitor 31 shunts resistor 20. Diodes 15 and 21 are poled so their anodes face toward the end terminals of the secondary winding of transformer 13.

An NPN clamping transistor 32 has a collector connected to the base of transistor 16, an emitter connected to ground, and a base connected to ground through a resistor 33. An inverter 34 and a resistor 38 is series couple the collector of transistor 22 to the base of transistor 32. A clamping transistor 35 has a collector connected to the base of switching transistor 22, an emitter directly connected to ground, and a base connected to ground through a resistor 36. An inverter 37 and a resistor 39 in series couple the collector of transistor 16 to the base of transistor 35.

Inverters 34 and 37 provide cross coupled feedback from the outputs of switching transistors 16 and 22 to the inputs of clamping transistors 32 and 35. This cross coupled feedback has a given significant transmission delay relative to the width of the ternary pulses, but smaller in magnitude than the minimum interval between successive ternary pulses. The minimum interval between successive ternary pulses is the interval between pulses when pulses occupy each time slot or bit position. In the preferred embodiment, this transmission delay is provided by the inherent delay in inverters 34 and 37 themselves.

Figure 2:
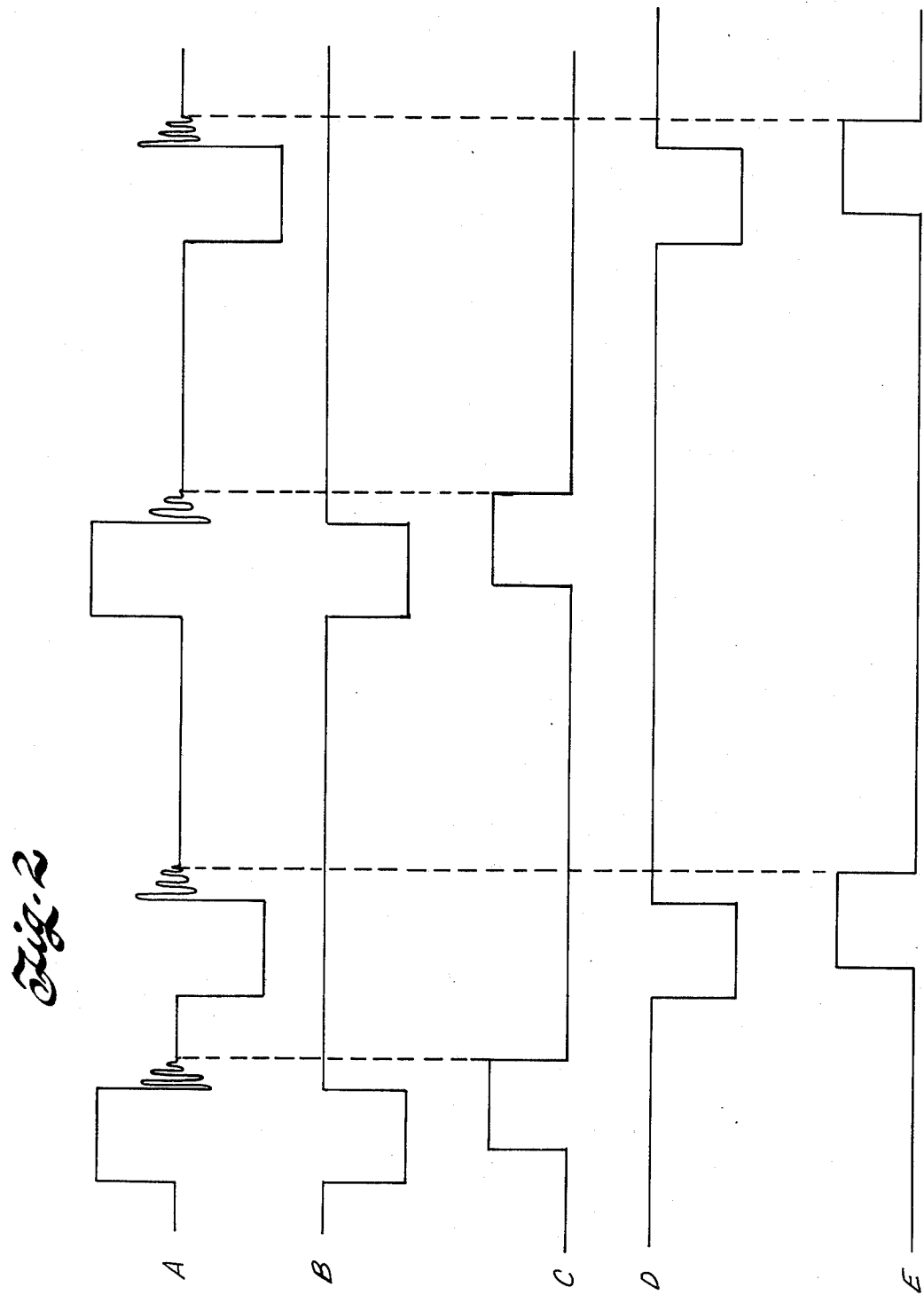
FIG. 2 is a number of waveforms representing the signals at different points in the circuitry of FIG. 1.

The letters A through E in FIG. 1 identify the points in the overshoot suppression circuitry where waveforms A through E of FIG. 2 appear.

With reference to waveforms A through E in FIG. 2, the described circuitry of FIG. 1 operates as follows: In the absence of ternary pulses at output terminals 11 and 12 of source 10, switching transistors 16 and 22 and clamping transistors 32 and 35 are nonconducting, i.e., turned off. Thus, the output terminal, i.e., the collector, of each of switching transistors 16 and 22 is "high", i.e., approximately at the potential of bias source $V_c$. As represented by waveform A, the ternary pulses appearing across output terminals 11 and 12 are subject to the baseline overshoot at their respective trailing edges. (Although the ternary pulses are also subject to peak overshoot at their respective leading edges, this is not represented in waveform A because the peak overshoot is not a problem in distinguishing the ternary pulses.) The baseline overshoot at the trailing edge of each ternary pulse is similar in nature to the next subsequent ternary pulse and may be difficult to distinguish therefrom if such overshoot is similar in magnitude to the threshold level of the discriminator to which the ternary pulses are applied. Switching transistors 16 and 22 serve as such discriminators in the disclosed circuitry. Their threshold level is set by the forward bias, voltage drop across the base-to-emitter junctions of switching transistors 16 and 22, typically of the order of 0.6 volts. When a ternary pulse of one polarity appears across output terminals 11 and 12, the end of the secondary winding of transformer 13 connected to resistor 14 assumes a positive potential, and the end connected to resistor 20 assumes a negative potential. If the positive potential is above the threshold level, transistor 16 conducts, i.e., turns on, and its output, i.e., collector, becomes "low," i.e., assumes a potential near ground, as illustrated by waveform B. Diode 21 is back biased and blocks transmission to transistor 22. The output of inverter 37 becomes high after the given transmission delay in the corresponding feedback path to turn on clamping transistor 35 and clamp the base of switching transistor 22 to a potential near ground, thereby preventing it from turning on. The given transmission delay exceeds the period of time during which baseline overshoot above the threshold level may be expected to appear, as illustrated by waveform C. Accordingly, the baseline overshoot following the ternary pulse transmitted by switching transistor 16 is suppressed in that it is not able to turn switching transistor 22 on regardless of the magnitude of such overshoot. When a ternary pulse of the other polarity appears across output terminals 11 and 12, the end of the secondary winding of transformer 13 connected to resistor 20 assumes a positive potential, and the end connected to resistor 14 assumes a negative potential. If the positive potential is above the threshold level, transistor 22 conducts, i.e., turns on, and its output, i.e., collector, becomes "low", i.e., assumes a potential near ground, as illustrated by waveform D. Diode 15 is back biased and blocks transmission to transistor 16. The output of inverter 34 becomes high after the given transmission delay in the corresponding feedback path to turn on clamping transistor 32 and clamp the base of switching transistor 16 to a potential near ground, thereby preventing it from turning on. The given transmission delay exceeds the period of time during which baseline overshoot above the threshold level may be expected to appear, as illustrated by waveform E. Accordingly, the baseline overshoot following the ternary pulse transmitted by switching transistor 22 is suppressed in that it is not able to turn switching transistor 16 on regardless of the magnitude of such overshoot.

In summary, resistor 14, diode 15, and switching transistor 16 serve as an indicating circuit responsive to ternary pulses on one polarity above a threshold level to transmit an indication to a load. Resistor 20, diode 21, and switching transistor 22 serve as an indicating circuit responsive to ternary pulses of the other polarity above the threshold level for transmitting an indication to the load. The indicating circuits thus operate alternately one at a time. The cross coupled feedback and clamping transistors 32 and 35 serve alternately to inhibit transmission of an indication to the load by one indicating circuit for a given period of time after the termination of a pulse above the threshold level to which the other indicating circuit has transmitted an indication.

In a typical example, the repetition rate of the ternary pulses is 1.554 megabits/sec., the pulse duration is approximately 250 nanoseconds, the minimum interval between successive ternary pulses is approximately 400 nanoseconds, and the given transmission delay provided by the cross coupled feedback is approximately 125 nanoseconds. Typically, the described circuitry would be required to distinguish ternary pulses having a change in magnitude of the order of from 2 to 4 volts, and would be subject to overshoot of as much as 1.6 volts. With the addition of noise, the overshoot could thus exceed the minimum magnitude of the ternary pulses themselves and thereby be mistaken for such pulses.

It should be noted that the described circuitry dissipates very little power in the absence of ternary pulses across output terminals 11 and 12 because switching transistors 16 and 22 and clamping transistors 32 and 35 are turned off, i.e., their outputs are all high. Responsive to a ternary pulse of one polarity, the outputs of switching transistor 16 and clamping transistor 35 become low, and responsive to ternary pulses of the other polarity the outputs of switching transistor 22 and clamping transistor 32 become low.

Switching transistors 16 and 22 may be viewed as normally closed switches in that they transmit the ternary pulses from source 10 to their outputs. By virtue of the action of clamping transistors 32 and 35 after the given time delay provided by the cross coupled feedback, the normally closed switches, i.e., switching transistors 16 and 22, alternately open, in that transmission of pulses from source 10 to their respective outputs is inhibited during a time interval equal to the duration of a pulse from source 10 transmitted by the other normally closed switch.

A light emitting diode 40, which is optically coupled to a photosensitive resistor 41 as indicated at 42, provides automatic gain control for the described overshoot suppression circuitry. Diode 40 and a current limiting resistor 43 are connected in series between bias source $V_c$ and the collector of switching transistor 16. Diode 40 and a current limiting resistor 44 are connected in series between bias source $V_c$ and the collector of switching transistor 22. A capacitor 45 shunts diode 40 to average fluctuations in the current flowing through diode 40 and resistors 43 and 44. Resistor 41 is connected between the anodes of diodes 15 and 21. In operation, as the level of the ternary pulses appearing between output terminals 11 and 12 changes, the duration of the pulses appearing at the output of switching transistors 16 and 22 experiences a corresponding change. As a result, the average current flowing through diode 40 changes to vary the average light intensity coupled thereby to photosensitive resistor 41, which adjusts its resistance in a sense so as to counteract the change in level of the ternary pulses. The described automatic gain control circuitry provides an effective means of coupling the level sensor, i.e., diode 40, to the floating, i.e., ungrounded, ternary pulse transmission paths. Capacitors 30 and 31 serve to extend the operating range of the automatic gain control by storing the direct current components of the ternary pulses applied to switching transistors 16 and 22.

The nature of the load connected to the outputs of switching transistors 16 and 22 depends upon the use that is to be made of the ternary pulses from source 10. The invention can be put to particularly advantageous use in the error detector described in application Ser. No. 699,619, filed June 25, 1976, by Tommy L. Sandlin, which is assigned to the assignee of the present application. This application issued as U.S. Pat. No. 4,070,646, on Jan. 24, 1978. The disclosure of the Sandlin application is incorporated herein fully by reference. In this use of the invention, it is assumed that successive ternary pulses alternate in polarity, as illustrated by waveform A. An up-down counter 50 detects an error in the ternary pulses when successive pulses of the same polarity occur. The output of switching transistor 16 is connected to the count up (C.U.) input of counter 50, and the output of switching transistor 22 is connected to the count down (C.D.) input of counter 50. Counter 50 has four states that are used to detect errors. As long as successive ternary pulses applied to counter 50 alternate in polarity, counter 50 remains in a second state or a third state. When successive pulses of the same polarity appear, counter 50 assumes either the first or fourth state, thereby energizing an output terminal B which is coupled to an error indicator 51 and via inverters 52 and 53 to a clear (CLR) input of counter 50. The CLR input resets counter 50 into its second or third state. The output of switching transistor 16 is also connected to a pulse indicator 54. Counter 50, error indicator 51, and pulse indicator 54 are constructed in the manner described in the referenced Sandlin application.

Figure 3:
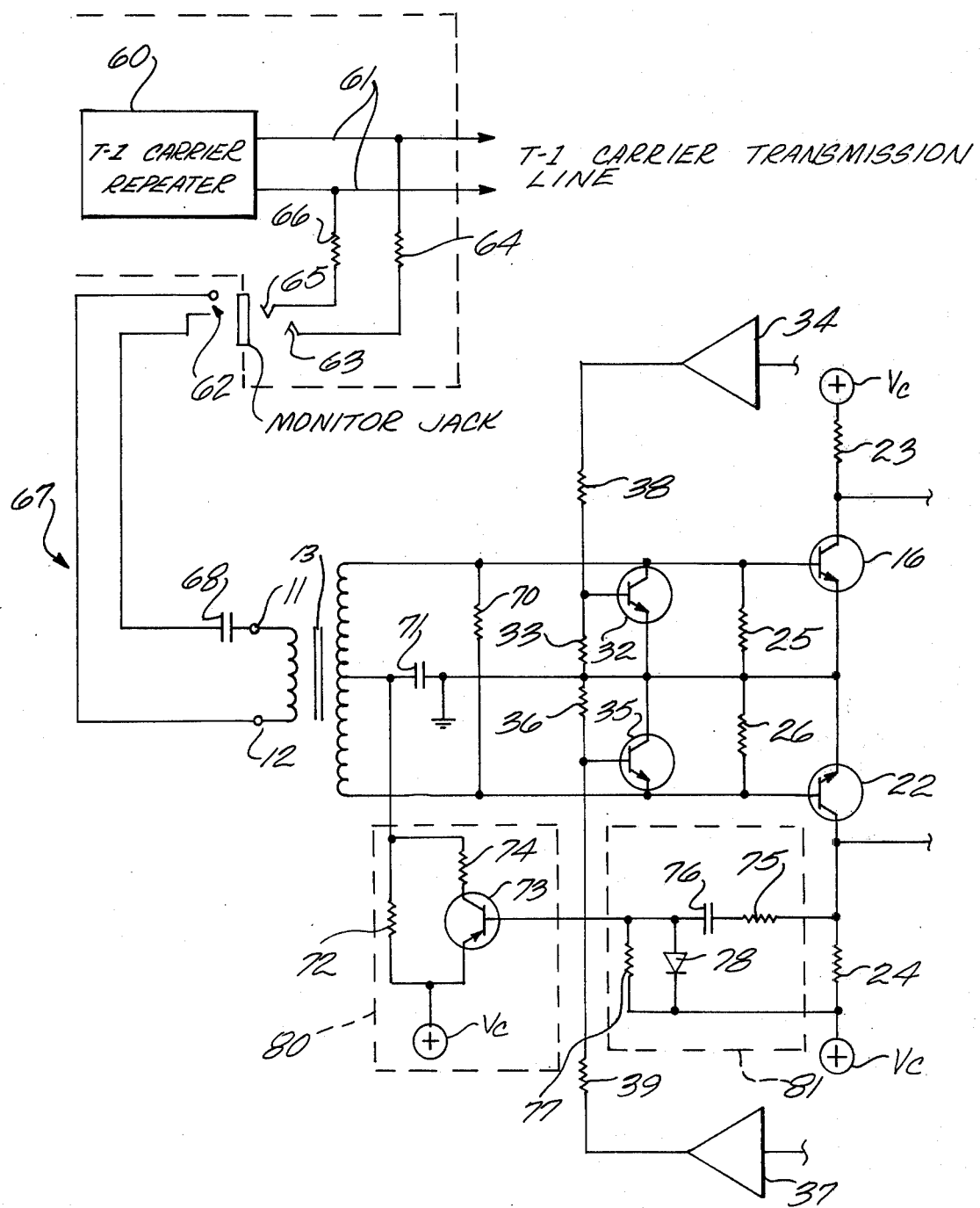
FIG. 3 is a schematic circuit diagram partially in block form of another embodiment of overshoot suppression circuitry incorporating the principles of the invention.

In the embodiment of FIG. 3, the components common with the components of FIG. 1 bear the same reference numerals. It is assumed that source 10 is a conventional T-1 carrier repeater 60, the output of which is connected to a carrier transmission line 61. Such a T-1 carrier repeater conventionally has a monitor jack having a jack terminal 63 coupled by an isolating resistor 64, and a jack terminal 65 coupled by an isolating resistor 66 to the respective conductors of transmission line 61. A plug 62 having terminals that engage jack terminals 63 and 65 is connected by a cable 67 and a capacitor 68 to input terminals 11 and 12. A resistor 70 is connected in parallel across the secondary winding of transformer 13. The resistance of resistors 64 and 66 and resistor 70 is sufficiently large to cause a substantial reduction in the signal level at the output of carrier repeater 60, e.g., typically of the order of 5:1. This has the effect of reducing by an equal factor the total value of the dynamic range of the pulse level the circuitry must accommodate.

At the center tap of the secondary winding, transformer 13 is coupled by a capacitor 71 to ground and by a large resistor 72 to bias source $V_c$. The emitter of a transistor 73 is connected to bias source $V_c$ and the collector of transistor 73 is connected by a small resistor 74 to the junction of resistor 72 and capacitor 71. The described circuitry enclosed in a box 80 functions as a bias turn-on switch.

The base of transistor 73 is connected by a resistor 75 and a capacitor 76 in series to the junction of the collector of transistor 22 with resistor 24. A resistor 77 directly connects the base of transistor 73 to bias source $V_c$. A diode 78 is connected in parallel with resistor 77. The described circuitry enclosed in a box 81 functions as a pulse level sensor.

In operation, in the absence of a minimum pulse level, transistor 73 is turned off, i.e., nonconducting, and the high resistance of resistor 72 produces a very low bias voltage, e.g., typically of the order of 0.13 volts across the base-emitter junctions of transistors 16 and 22. The current drain in such case is very small, e.g., typically of the order of 30 to 40 microamps. When the minimum pulse level is exceeded across the secondary winding of transformer 13, the voltage at the collector of transistor 22 drops, thereby actuating sensor 81 and causing transistor 73 of bias turn-on switch 80 to conduct, i.e., turn on. When transistor 73 conducts, the low resistance of resistor 74 raises the bias voltage applied across the base-emitter junctions of transistors 16 and 22 to the normal operating value. From the foregoing, it will be apparent that the resistance value of resistor 72 is selected to provide sufficient bias to transistors 16 and 22 to turn on transistor 73, when the minimum pulse level occurs across the secondary winding of transformer 13. Resistor 75 performs a current limiting and load isolation function. Capacitor 76 provides alternating current coupling to the base-emitter of transistor 73. Without capacitor 76, transistor 73 could not be turned off once it is turned on. Resistor 77 serves as a pulldown resistor to prevent appreciable collector-emitter leakage current through transistor 73 in the absence of ternary pulses above the minimum pulse level. Diode 78 prevents the build-up of a charge on capacitor 76, which would otherwise block signal transmission from the collector of transistor 22 to the base of transistor 73. The time constants provided by capacitor 76 and resistors 75 and 77 are such that the increase in the pulse level at the secondary winding of transformer 13 above the minimum value instantaneously turns on transistor 73. Capacitor 71 is large enough to smooth out the voltage variations, which would otherwise appear at the center tap of the secondary winding of transformer 13 as transistor 73 turns on and off with each pulse.

Bias turn-on switch 80 and pulse level sensor 81 are a substitute for the automatic gain control provided by light emitting diode 40, photosensitive resistor 41, and the associated circuitry in FIG. 1. When bias turn-on switch 80 conducts, transistors 16, 22, 32, and 35 function in the manner described in connection with FIGS. 1 and 2. The collector of transistor 16 is connected to the input of pulse indicator 54; the collectors of transistors 16 and 22 are connected to the count up and count down inputs, respectively, of counter 50 and the inputs of inverters 37 and 34, respectively, as in FIG. 1.

It should be noted that because pulse level sensor 81 is connected to transistor 22, the first pulse sensed by the circuitry will always be negative. Thereafter, both negative and positive pulses are sensed by virtue of the voltage stored across capacitor 71.

In both embodiments of the invention, very little current drain is imposed upon bias source $V_c$ in the absence of ternary pulses. This feature enables the invention to be employed in battery powered portable equipment without the necessity of an on/off switch.

The overshoot suppression circuitry of the invention permits detection of errors in ternary pulse transmission for ternary pulses varying in magnitude over a wide range despite the presence of large baseline overshoot.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention. For example, instead of both terminals of source 10 being ungrounded, one terminal could be grounded while the other terminal is ungrounded, and the ungrounded terminal could be coupled to the switching transistors by oppositely poled diodes. What is claimed is:

1. A system for suppressing overshoot comprising:
   a source of ternary pulses subject to baseline overshoot above a threshold level for less than a given period of time after termination of each pulse;
   load means for detecting the occurrence of successive ternary pulses of the same polarity;
   a first indicating circuit connecting the source to the load means, the first indicating circuit including means responsive to ternary pulses of positive polarity above the threshold level for transmitting an indication to the load means;
   a second indicating circuit connecting the source to the load means, the second indicating circuit including means responsive to ternary pulses of negative polarity above the threshold level for transmitting an indication to the load means;
   means for inhibiting transmission of an indication to the load means by the second indicating circuit for a given period of time after the termination of an indication by the first indicating circuit; and
   means for inhibiting transmission of an indication to the load means by the first indicating circuit for the given period of time after the termination of an indication by the second indicating circuit.

2. The system of claim 1, in which the given period of time is smaller than the minimum interval between successive ternary pulses.

3. The system of claim 1, in which the detecting means comprises a resettable up-down counter having first, second, third, and fourth successive states, a count up input, and a count down input, one of the indicating circuits transmits an indication to the count up input to change the state of the counter in one direction, and the other indicating circuit transmits an indication to the count down input to change the state of the counter in the other direction, and means for resetting the counter into the second or third state and for generating an error signal when the counter assumes the first or fourth state.

4. The system of claim 3, additionally comprising means for automatically controlling the level of the ternary pulses from the source to counteract variations thereof.

5. The system of claim 1, in which the first indicating circuit comprises a first switching transistor having an output connected to the load and an input, the output of the first transistor being high when its input is low and vice versa, and first means for connecting the source to the input of the first switching transistor to couple thereto ternary pulses of positive polarity to the exclusion of ternary pulses of negative polarity; the second indicating circuit comprises a second switching transistor having an output connected to the load and an input, the output of the second transistor being high when its input is low and vice versa, and second means for connecting the source to the input of the second switching transistor to couple thereto ternary pulses of negative polarity to the exclusion of ternary pulses of positive polarity; the means for inhibiting transmission by the first indicating circuit comprises a first inverter having a significant transmission delay relative to the duration of the ternary pulses but smaller than the minimum interval between successive ternary pulses, the first inverter having an input connected to the output of the second switching transistor and an output, and a first clamping circuit having an input to which the output of the first inverter is connected, and an output connected to the input of the first switching transistor, the output of the clamping circuit clamping the input of the first switching transistor low when the input of the first clamping circuit is high to prevent the output of the first switching transistor from becoming low; and the means for inhibiting transmission of an indication by the second indicating circuit comprises a second inverter having a significant transmission delay relative to the duration of the ternary pulses but smaller than the minimum interval between successive ternary pulses, the second inverter having an input connected to the output of the first switching transistor and an output, and a second clamping circuit having an input to which the output of the second inverter is connected and an output that clamps the input of the second switching transistor low when the input of the second clamping circuit is high to prevent the output of the second transistor from becoming low.

6. The system of claim 5, in which the load comprises means for detecting the occurrence of successive ternary pulses of the same polarity.

7. The system of claim 6, in which the detecting means comprises a resettable up-down counter having first, second, third, and fourth successive states, a count up input, and a count down input, one of the indicating circuits transmits an indication to the count up input to change the state of the counter in one direction, and the other indicating circuit transmits an indication to the count down input to change the state of the counter in the other direction, and means for resetting the counter into the second or third state and for generating an error signal when the counter assumes the first or fourth state.

8. The system of claim 7, in which the source has first and second ungrounded output terminals, the first connecting means comprising a diode poled in a given direction relative to the first output terminal, and the second connecting means comprising a diode poled in the given direction relative to the second output terminal.

9. The system of claim 3, additionally comprising a bias source for energizing the indicating circuits, means for effectively disconnecting the bias source from the indicating circuits in the absence of a minimum pulse level at the source, means for sensing the pulse level at the source, and means responsive to the sensing means for connecting the bias source to the indicating circuits when the minimum pulse level at the source is exceeded.

10. A system for suppressing overshoot comprising:
a source of ternary pulses having first and second ungrounded output terminals, the ternary pulses being subject to baseline overshoot;
a load;
a first normally closed switch connected between the first output terminal of the source and the load;
a second normally closed switch connected between the second output terminal of the source and the load;
means responsive to pulses of the given polarity at the first output terminal after a time delay for opening the second switch during a time interval equal to the duration of pulses at the first output terminal of the source;
means responsive to pulses of the given polarity at the second output terminal after a time delay for opening the first switch during a time interval equal to the duration of the pulses at the second output terminal of the source;
a light emitting diode;
means for applying to the light emitting diode an average current representative of the level of the ternary pulses from the source; and
a photosensitive resistor shunting the first and second output terminals of the source, the photosensitive resistor being optically coupled to the light emitting diode to counteract changes in the level of the ternary pulses from the source.

11. The system of claim 10, in which the first switch comprises a first switching transistor having an input and an output, the first transistor being nonconductive in the absence of pulses of a given polarity at the first output terminal of the source and being conductive in the presence of pulses of the given polarity at the first output terminal of the source; the second switch comprises a second switching transistor having an input and an output, the second transistor being nonconductive in the absence of pulses of the given polarity at the second output terminal of the source and being conductive in the presence of pulses of the given polarity at the second output terminal of the source; the means for opening the second switch comprises a clamping circuit for clamping the input of the second transistor to a potential that maintains the second transistor nonconducting when the clamping circuit is actuated, and a feedback connection with transmission delay from the output of the first switching transistor to the clamping circuit to actuate the clamping circuit when the first transistor is conducting; and the means for opening the first switch comprises a clamping circuit for clamping the input of the first transistor to a potential that maintains the first transistor nonconducting when the clamping circuit is actuated, and a feedback connection with transmission delay from the output of the second transistor to the clamping circuit to actuate the clamping circuit when the second transistor is conducting.

12. Overshoot suppression circuitry for a source of ternary pulses having first and second ungrounded output terminals, the ternary pulses being subject to baseline overshoot, the system comprising:
a load
a first switching transistor having an input connected to the first output terminal of the source and an output connected to the load, the output of the first transistor being high when its input is low and vice versa;
a second switching transistor having an input connected to the second output terminal of the source and an output connected to the load, the output of the second transistor being high when its input is low and vice versa;
a first inverter having a significant transmission delay relative to the duration of the ternary pulses, but smaller than the minimum interval between successive ternary pulses, the first inverter having an input connected to the output of the second transistor and an output;
a second inverter having a significant transmission delay relative to the duration of the ternary pulses, but smaller than the minimum interval between successive ternary pulses, the second inverter having an input connected to the output of the first transistor and an output;
a first clamping circuit having an input to which the output of the first inverter is connected and an output connected to the input of the first transistor, the output of the first clamping circuit clamping the input of the first transistor low when the input of the first clamping circuit is high, to prevent the output of the first transistor from going low;

a second clamping circuit having an input to which the output of the second inverter is connected and an output that clamps the input of the second transistor low when the input of the second clamping circuit is high, to prevent the output of the second transistor from going low;

means for applying a low bias level to the first and second switching transistors in the absence of a minimum pulse level at the inputs of the first and second switching transistors;

means for sensing the pulse level at the inputs to the first and second switching transistors; and means responsive to the sensing means when the minimum pulse level at the inputs to the switching transistors is exceeded for applying a high bias level to the first and second switching transistors.

13. The circuitry of claim 12, in which the first and second clamping circuits each comprise a transistor having an emitter connected to a reference potential suitable to clamp the input of the corresponding switching transistor low, a base that is the input and a collector that is the output, each clamping transistor being conductive when its input is high to couple the reference potential to the input of the corresponding switching transistor, and being nonconductive when its input is low.

14. The circuitry of claim 13, in which the first and second switching transistors are conductive when their outputs are low and are nonconductive when their outputs are high, the first and second switching transistors becoming conductive when a ternary pulse is applied to the respective inputs while the corresponding clamping circuit is not actuated.

15. The circuitry of claim 12, in which the means for applying a low bias level comprises a bias source and a large resistor connecting the bias source to the first and second switching transistors; and the means for applying a high bias level comprises a bias turn-on transistor having an emitter and a collector connected in parallel with the large resistor, the sensing means turning on the transistor when the minimum pulse level is exceeded.

16. The circuitry of claim 15, in which the bias turn-on transistor has a base, the sensing means comprises a resistor and a capacitor connected between the output of one of the switching transistors and the base of the bias turn-on transistor, and a pulldown resistor connected from the base of the bias turn-on transistor to the bias source.

17. The circuitry of claim 16, in which the sensing means additionally comprises a diode connected in parallel with the pull down resistor.

* * * * *